(12) United States Patent
Nakazawa et al.

(10) Patent No.: US 7,405,107 B2
(45) Date of Patent: Jul. 29, 2008

(54) SEMICONDUCTOR DEVICE, METHOD AND APPARATUS FOR FABRICATING THE SAME

(75) Inventors: Shusaku Nakazawa, Oobu (JP); Tsutomu Onoue, Kariya (JP); Hiroaki Mizuno, Kariya (JP); Hidehisa Nasu, Oobu (JP)

(73) Assignee: Denso Corporation, Kariya (JP)

( * ) Notice: Subject to any disclaimer, the term of this patent is extended or adjusted under 35 U.S.C. 154(b) by 200 days.

(21) Appl. No.: 11/273,415

(22) Filed: Nov. 14, 2005

(65) Prior Publication Data
US 2006/0108700 A1 May 25, 2006

(30) Foreign Application Priority Data
Nov. 19, 2004 (JP) .............................. 2004-335920

(51) Int. Cl.
*H01L 21/44* (2006.01)
*H01L 21/48* (2006.01)

(52) U.S. Cl. ........................ 438/124; 438/123; 438/127; 257/796; 257/E23.051

(58) Field of Classification Search ................. 438/124, 438/127, 112, 123; 257/796, E23.051
See application file for complete search history.

(56) References Cited

U.S. PATENT DOCUMENTS

| | | | |
|---|---|---|---|
| 6,048,483 A | 4/2000 | Miyajima | |
| 6,224,360 B1 | 5/2001 | Miyajima | |
| 6,893,898 B2 * | 5/2005 | Ito et al. | 438/108 |
| 2002/0171173 A1 * | 11/2002 | Tsuchida | 264/272.17 |
| 2004/0104458 A1 * | 6/2004 | Tsukada et al. | 257/669 |

FOREIGN PATENT DOCUMENTS

| | | |
|---|---|---|
| JP | 10-34699 | 2/1998 |
| JP | 10-223669 | 8/1998 |
| JP | 11-307559 | 11/1999 |
| JP | 2003-154551 | 5/2003 |

* cited by examiner

*Primary Examiner*—Nitin Parekh
(74) *Attorney, Agent, or Firm*—Harness, Dickey & Pierce, PLC

(57) ABSTRACT

A semiconductor device has at least one semiconductor element, at least one radiator plate thermally connected with said semiconductor element, and a molded resin covering and sealing said semiconductor device and said radiator, wherein an outer main surface of the radiator plate and at least a part of the side surface adjoining the outer main surface are exposed from the molded resin.

6 Claims, 5 Drawing Sheets

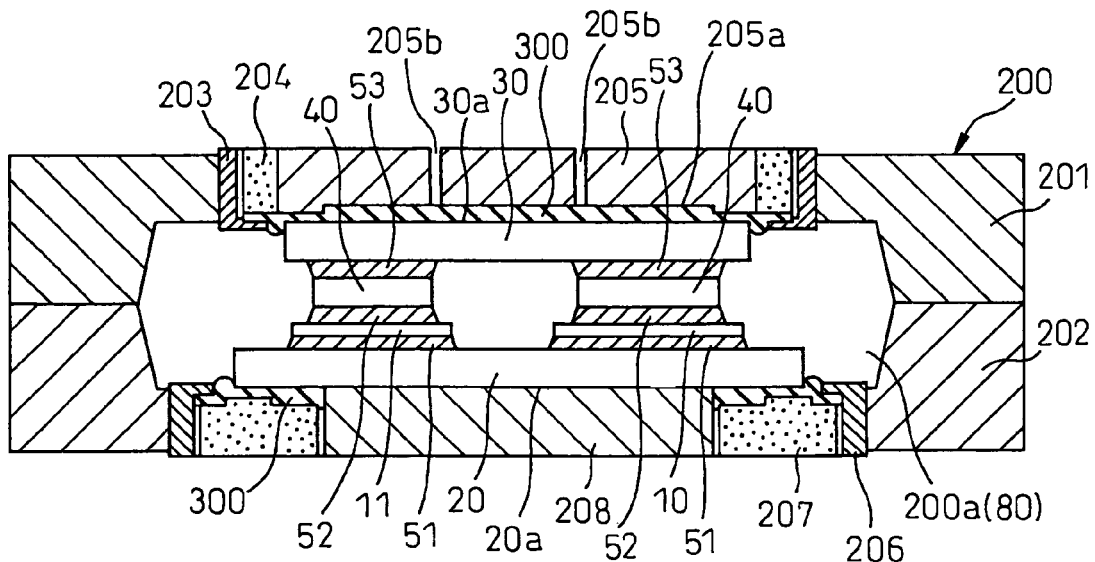
Fig. 5
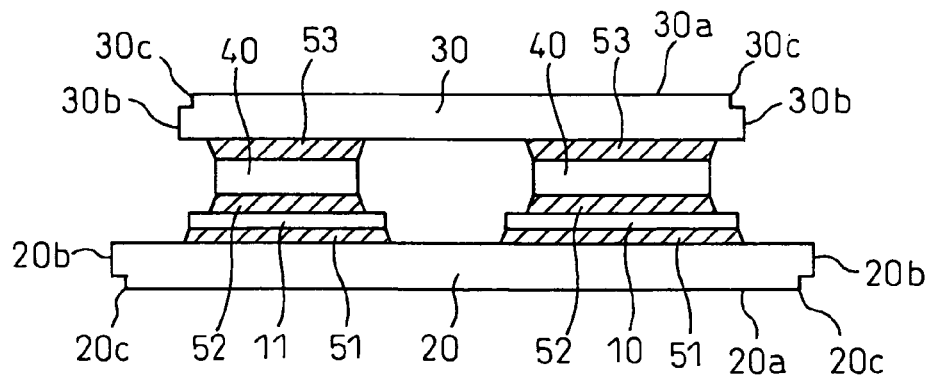
Fig. 6
Fig. 7 PRIOR ART
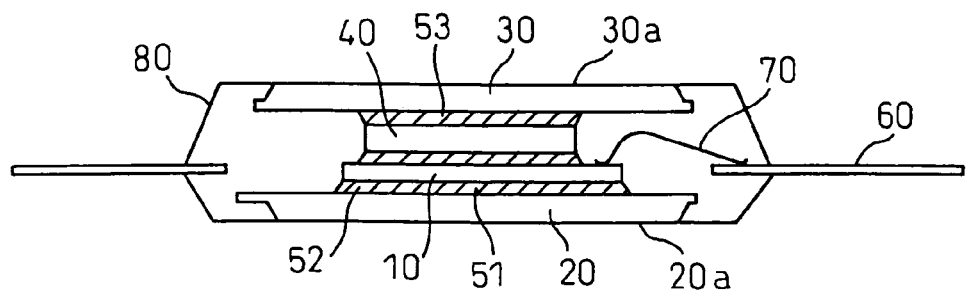

SEMICONDUCTOR DEVICE, METHOD AND APPARATUS FOR FABRICATING THE SAME

BACKGROUND OF THE INVENTION

1. Field of the Invention

This invention relates to a semiconductor device formed by sealing at least a semiconductor element thermally connected to a radiator plate with a molded resin, a method of fabricating the semiconductor device and an apparatus for fabricating the semiconductor device, or in particular to a semiconductor device formed by sealing at least a semiconductor element sandwiched between a pair of radiator plates with a molded resin, a method of fabricating the semiconductor device and an apparatus for fabricating the semiconductor device.

2. Description of the Related Art

FIG. 7 is a schematic diagram showing a sectional structure of an ordinary resin molded semiconductor device.

Generally, in the semiconductor of this type, as shown in FIG. 7, the two surfaces of a semiconductor element 10 are sandwiched by radiator plates 20, 30 and the resulting assembly is sealed with a molded resin 80 so as to expose the radiation surfaces 20a, 30a of the radiator plates 20, 30. In other words, the parts of the semiconductor device other than the radiation surfaces 20a, 30a of the radiator plates 20, 30 are sealed with the molded resin 80.

The heat generated from the active semiconductor element 10 is transmitted to the upper and lower radiator plates 20, 30 and radiated out of the semiconductor device from the radiation surfaces 20a, 30a of the radiator plates 20, 30.

The radiation surfaces 20a, 30a of the radiator plates 20, 30 are the widest surfaces of the radiator plates 20, 30, i.e. the outer main surfaces 20a, 30a of the pair of the radiator plates 20, 30 sandwiching semiconductor element 10.

In the semiconductor device shown in FIG. 7, the semiconductor element 10 is sandwiched between the pair of the radiator plates 20, 30 through a heat sink block 40 and conductive bonding materials 51 to 53 of such a material as solder or a conductive adhesive.

In the molded resin 80, at least a lead frame 60 is arranged around the semiconductor element 10, which is electrically connected to each lead frame 60 through a wire 70.

This semiconductor device can be fabricated by molding the semiconductor element 10 with the radiator plates 20, 30 according to the transfer molding process using a resin-sealing die.

FIG. 8 is a sectional view schematically showing the conventional ordinary molding method using the die 200 for the semiconductor device. As shown in FIG. 8a, a cavity 200a is formed in the die 200 by joining an upper die 201 and a lower die 202 each other.

First, the semiconductor element 10 is sandwiched by a pair of the radiator plates 20, 30 and connected to a lead frame 60 through a wire 70. Then, the resulting assembly is set in the cavity 200a of the die 200 and a resin is injected and filled in the die 200, which is thus sealed by the molded resin 80.

In this molding method using resin, as shown in FIG. 8a, the tolerance of the work thickness generally requires a clearance K to be formed between the upper die 201 and the radiation surface 30a.

At the time of molding, resin flows into the clearance K. As a result, as shown in FIG. 8b, the radiation surface 30a of the upper radiator plate 30 of the completed semiconductor device is covered with the mold resin 80.

In other words, a resin burr can be easily formed on the radiation surface 30a of the radiator plate 30. This is the same on the radiation surface 20a of the lower radiator plate 20.

Once the resin burr occurs, the radiation efficiency of the radiation surfaces 20a, 30a is undesirably reduced.

In a conventional method which has been proposed to prevent from forming the resin burr on the radiator plates 20, 30, a heat-resistant, a flexible material is inserted between the die and the radiation surfaces to fill the clearance and prevents the intrusion of the mold resin (Japanese Patent No. 3350444).

Also, a method has been proposed to prevent the intrusion of the mold resin onto the radiation surfaces by bonding the radiation surfaces of the radiator plates to the die and thus eliminating the clearance (Japanese Unexamined Patent Publication No. 10-223669).

Furthermore, with the semiconductor device having such a configuration that at least a semiconductor element is sandwiched by a pair of radiator plates and heat is radiated from the two surfaces of the semiconductor element, the radiation surface of one radiator plate is likely to be tilted relative to the radiation surface of the other radiator plate. Therefore, it is difficult to hold the two radiation surfaces parallel to each other.

A semiconductor device including a semiconductor element sandwiched by a pair of radiator plates and sealed by the molded resin, has normally a cooling structure in which a cooling member is arranged in contact with each radiation surface of the radiator plate pair so as to sandwich the semiconductor device.

The radiation surfaces are cooled with the cooling members to speed up the heat radiation from the radiation surfaces.

In this case, however, a poor parallelism between the radiation surfaces of the radiator plates would lead to a gap and an insufficient contact between each radiation surface and the corresponding cooling member, thereby often deteriorating the heat radiation efficiency.

The deterioration of the parallelism between the radiation surfaces is conspicuous in many cases where a plurality of semiconductor elements are sandwiched between a pair of radiator plates. This is due to the often irregular thickness of the semiconductor elements which makes it difficult to maintain the parallelism between the radiation surfaces.

The present inventors have tried to secure a satisfactory parallelism between the radiation surfaces of the radiator plates by cutting or grinding the radiation surfaces and thus adjusting the parallelism between the radiation surfaces after sealing the device with the molded resin.

In the conventional semiconductor device, as shown in FIG. 7, the side surfaces of the radiator plates 20, 30 are sealed with the molded resin although the radiation surfaces 20a, 30a of the radiator plates 20, 30 are exposed from the mold resin 80.

When the radiation surfaces 20a, 30a are cut or ground with a machining member such as a cutting tool or a grinding stone, therefore, the risk of the machining member cutting the very hard molded resin 80 together with the radiator plates 20, 30 results in a very great consumption of the machining member. Thus, the life of the machining member is considerably shortened and the cost of machining the radiation surfaces becomes higher.

The radiation surfaces may be machined by shot blasting without using any machining member such as the cutting tool or the grinding stone. The shot blasting is not undesirable, however, because of the need of the cleaning and drying processes after machining and a higher cost of materials such as abrasives.

The aforementioned problem of the great consumption and the shorter life of the machining member for cutting or grinding the radiation surfaces is not limited to the semiconductor device in which the two surfaces of the semiconductor element are sandwiched by a pair of radiator plates and the assembly is sealed with the molded resin while exposing the heat radiation surface of each radiator plate.

In other words, the problem of the machining member described above is shared by all the semiconductor devices in which the semiconductor element is thermally connected with the radiator plates and the resulting assembly is sealed with the molded resin so as to expose the radiation surfaces of the radiator plates.

SUMMARY OF THE INVENTION

The present invention has been achieved in view of the aforementioned problem, and an object of the invention is to provide a semiconductor device sealed with a molded resin in which radiator plates are thermally connected to a semiconductor element while at the same appropriately exposing the radiation surfaces of the radiator plates.

Another object of the present invention is to provide a semiconductor device in which the outer main surfaces, i.e. the radiation surfaces of the radiator plates are machined by a machining tool while suppressing the consumption and considerably improving the machining tool life.

In order to achieve the objects described above, according to a first aspect of the invention, there is provided a semiconductor device comprising at least one semiconductor element (10, 11), at least one radiator plate (20, 30) thermally connected to the semiconductor element (10, 11), and molded resin (80) covering and sealing the semiconductor device and radiator plate, the main surface (20a, 30a) of the radiator plate (20, 30) and at least a part of a side surface (20b, 30b) adjoining the outer main surface (20a, 30a), are exposed from the molded resin (80).

According to the first aspect, a part of the side surface (20b, 30b) and the boundary between the side surface (20b, 30b) and the main surface (20a, 30a) of the radiator plate (20, 30) are appropriately exposed from the mold resin (80). Therefore, when the radiation surfaces, i.e. the outer main surfaces (20a, 30a) of the radiator plates (20, 30) can be, for example, cut or ground by a cutting tool or a grinding stone, the machining tool such as the cutting tool or the grinding stone but brought into contact only with the radiator plate (20, 30) but not with the molded resin (80) during the machining operation.

Therefore, in the semiconductor device according to the first aspect of the invention in which the radiator plate (20, 30) is thermally connected to the semiconductor element (10, 11) and the resulting assembly is sealed by the molded resin (80) except for the radiation surface (20a, 30a) so as to expose the radiation surface (20a, 30a), the radiation surface is so appropriately exposed that the outer main surface (20a, 30a) served as the radiation surface of the radiator plate (20, 30) can be machined by the machining member while reducing the consumption of the machining member and thus considerably improving the life thereof.

In the semiconductor device according to the first aspect, a groove (81) is formed on the molded resin (80) around the outer main surface (20a, 30a) of the radiator plate (20, 30) and makes the part of the side surface (20b, 30b) of the radiator plate (20, 30) exposed from the molded resin.

The at least one radiator plate includes a pair of radiator plates (20, 30) each of which respectively arranged on both surfaces of the semiconductor element (10, 11) so as to sandwich the semiconductor element (10, 11).

By doing so, the neighborhood of the boundaries between the side surfaces (20b, 30b) and the main surfaces (20a, 30a) as well as the outer main surfaces (20a, 30a) of the pair of the radiator plates (20, 30) can be exposed from the molded resin (80).

Thus, there is provided a semiconductor device sealed with the molded resin so as to expose the radiation surfaces of the radiator plates connected with at least a semiconductor element, in which the semiconductor element is sandwiched by the pair of the radiator plates so as to expose the radiation surfaces of the radiator plates.

In this configuration, when the radiation surfaces, i.e. the outer main surfaces (20a, 30a) of the pair of the radiator plates (20, 30) are cut or ground or otherwise machined for the purpose of making both of the main surfaces (20a, 30a) parallel to each other, the machining tool such as the cutting tool or the grinding stone can be kept in contact only with the radiator plates (20, 30) but not with the molded resin (80), because at least the neighborhood of the boundaries (20c, 30c) between the side surfaces (20b, 30b) and the main surfaces (20a, 30a) of the two radiator plates (20, 30) is appropriately exposed from the mold resin (80).

As a result, according to this aspect, when the radiation surfaces (20a, 30a), which are the radiation surfaces of the radiator plates (20, 30), are machined by the machining tool, the consumption of the machining tool can be reduced and the machining tool life is greatly extended.

Further, the semiconductor device may have a plurality of the semiconductor elements (10, 11) sandwiched between the pair of the radiator plates (20, 30).

In the case where a plurality of the semiconductor elements (10, 11) are included, the probable difference in thickness between them often makes it necessary to machine the main surfaces (20a, 30a) in order to make radiation surfaces parallel to each other. The aspect of the invention has the more advantageous effects for the semiconductor device having a plurality of the semiconductor elements.

According to a second aspect of the invention, there is provided a method of fabricating a semiconductor device, wherein a work including at least one semiconductor element (10, 11) and at least one radiator plate (20, 30) which is thermally connected to the semiconductor element (10, 11) is arranged in a die (200) so as to be covered and sealed with a molded resin (80), comprising the steps of: arranging a heat-resistant and flexible sheet (300) larger than an outer main surface (20a, 30a) of the radiator plate (20, 30) on a portion of the die (200) facing the main surface (20a, 30a); and pressing the main surface (20a, 30a) against the sheet (300) so as to seal the work with the molded resin (80) while covering the sheet on at least a part of the side surface (20b, 30b) adjoining the main surface (20a, 30a) of the radiator plate.

In this way, the main surfaces (20a, 30a) i.e. the radiation surfaces are pressed against the heat-resistant, flexible sheet (300) larger than the main surfaces (20a, 30a), and therefore the sheet (300) is deformed so that the main surfaces (20a, 30a) of the radiator plates (20, 30) sink into the sheet (300).

As a result, at least the neighborhood of the outer peripheral edge of the main surfaces (20a, 30a) of the radiator plates (20, 30), i.e. the neighborhood of the boundaries (20c, 30c) between the side surfaces (20b, 30b) and the main surfaces (20a, 30a) is covered in close contact with the deformed sheet (300).

Under this condition, the assembly is sealed with the molded resin (80) thereby making it possible to fabricate the semiconductor device according to the first aspect appropriately. In other words, according to the second aspect of the invention, there is provided a method of fabricating the semiconductor device according to the first aspect of the invention in an appropriate manner.

The semiconductor device obtained according to the second aspect has the semiconductor element (10, 11) connected to the radiator plates (20, 30) and sealed by the molded resin (80) and the radiation surfaces are so appropriately exposed. Therefore, the outer main surfaces (20a, 30a) i.e. the radiation surfaces of the radiator plates (20, 30) can be machined while reducing the consumption of the machining tool, thereby improving the life of the machining tool considerably.

Further, the at least one radiator plate may include two radiator plates, and this pair of the radiator plates (20, 30) may be arranged on the two surfaces of the semiconductor element (10, 11) so as to sandwich the semiconductor element (10, 11).

By doing so, the semiconductor device obtained according to the second aspect has the semiconductor element (10, 11) is sandwiched by a pair of the radiator plates (20, 30) and sealed with the molded resin, wherein the radiation surfaces can be so appropriately exposed that the outer main surfaces (20a, 30a) i.e. the radiation surfaces of the radiator plates (20, 30) can be machined while reducing the consumption of the machining tool, and therefore the life of the machining tool is remarkably extended.

Each sheet (300) of the fabrication method according to the second aspect can use a material such as a fluorine or a silicone resin.

In this aspect of the invention, the whole main surfaces (20a, 30a) can be pressed against the sheet (300).

As an alternative, only the outer peripheral part of the main surfaces (20a, 30a) of the radiator plates (20, 30) can be pressed against the sheet (300).

According to a third aspect of the invention, there is provided a fabricating apparatus for fabricating a semiconductor device, comprising the die (200), in which a work including at least one semiconductor element (10, 11) and at least one radiator plate (20, 30) which is thermally connected to the semiconductor element (10, 11) is arranged so as to be covered and sealed with a molded resin, and a heat-resistant and flexible sheet (300) larger than the outer main surface (20a, 30a) of the radiator plate (20, 30), arranged on the portion of the die (200) facing the outer main surface (20a, 30a); wherein the sheet covers the outer main surface and at least a part of the side surfaces (20b, 30b) adjoining the main surface of the radiator plate (20, 30), when the main surface (20a, 30a) is pressed against the sheet (300) so as to seal the work with the molded resin (80).

According to the third aspect of the invention, fabrication apparatus for the fabrication method according to the second aspect can be appropriately implemented.

Therefore, the semiconductor device fabricated using the fabrication apparatus according to the third aspect has the radiator plates (20, 30) thermally connected to the semiconductor element (10, 11) and sealed with the molded resin (80), wherein the surfaces of the radiator plates can be appropriately exposed and, therefore, the outer main surfaces (20a, 30a) of the radiator plates (20, 30) can be machined while reducing the consumption of the machining tool, and the life of the machining tool can be extended remarkably.

The die (200) may have a limiter (203) for restricting an outward extension of the sheet (300) to form a bulge for covering the part of the side surface (20b, 30b).

The sheet (300) may be formed of a material containing fluorine or silicone resin.

Further, the sheet (300) may have an opening at the central part thereof. As a result, the die (200) can be clamped more sufficiently.

The part of the die supporting the sheet (300) may have a depression (205a) so as not to excessively press the sheet.

In the foregoing description, a reference numeral in the parentheses represent an example only for the purpose of reference. The numeral corresponds to an element of the embodiments hereinafter described, but does not limit the present invention.

BRIEF DESCRIPTION OF THE DRAWINGS

FIG. 4b is an enlarged view of the portion B in FIG. 4a.

FIG. 4c is an enlarged view of the portion C in FIG. 4a.

FIG. 5 is a sectional view schematically showing a method of forming the mold resin according to a modification of the aforementioned embodiment using a punched sheet.

FIG. 6 is a sectional view schematically showing another modification of the same embodiment.

FIG. 7 is a sectional view schematically showing the conventional ordinary semiconductor device.

DETAILED DESCRIPTION OF THE INVENTION

Figure 1:
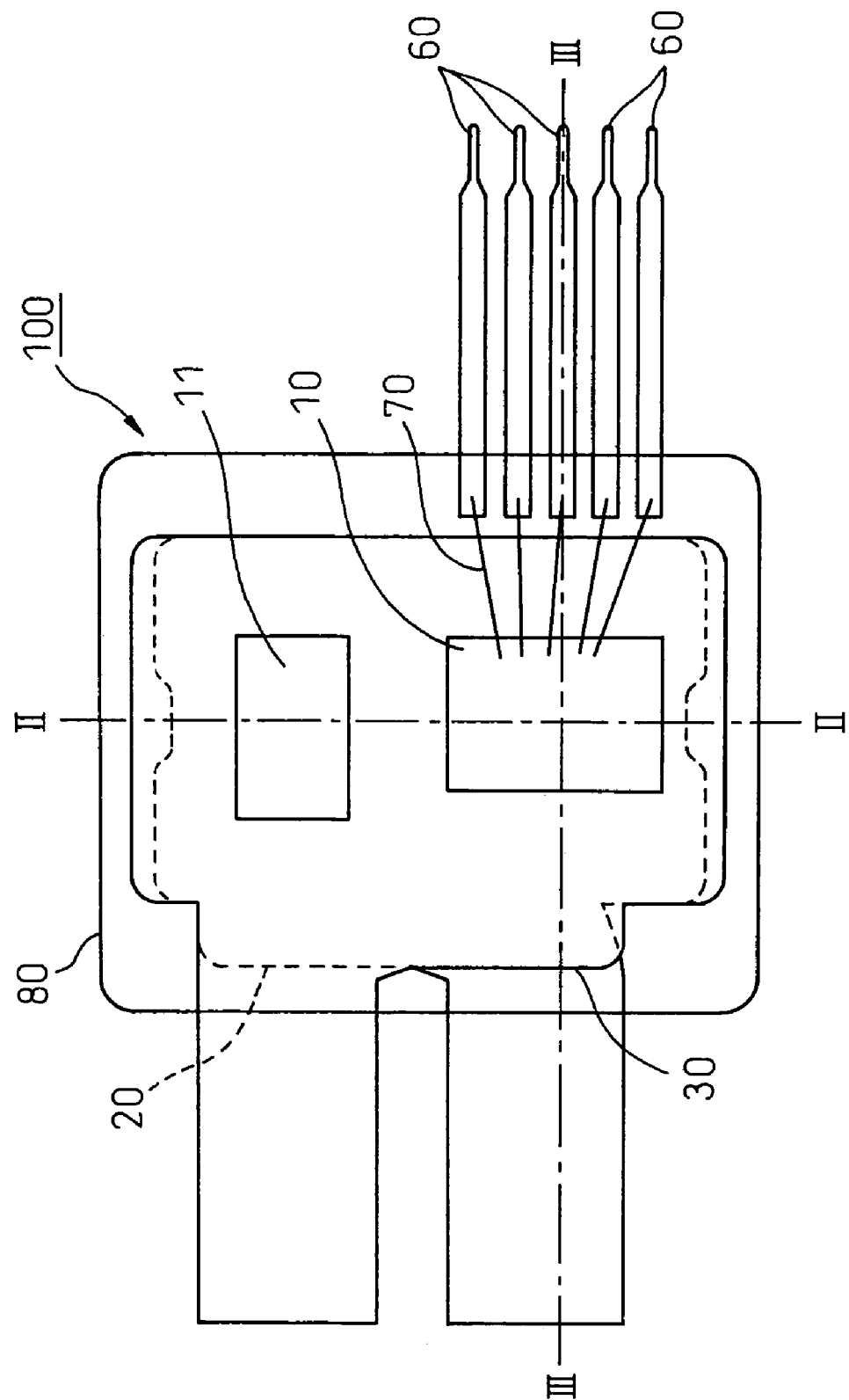
FIG. 1 is a plan view schematically showing a semiconductor device according to an embodiment of the invention.

Embodiments of the invention are described below with reference to the drawings. In the drawings, the identical or equivalent parts are designated by the same reference numerals, respectively, to simplify the explanation.

Figure 2:
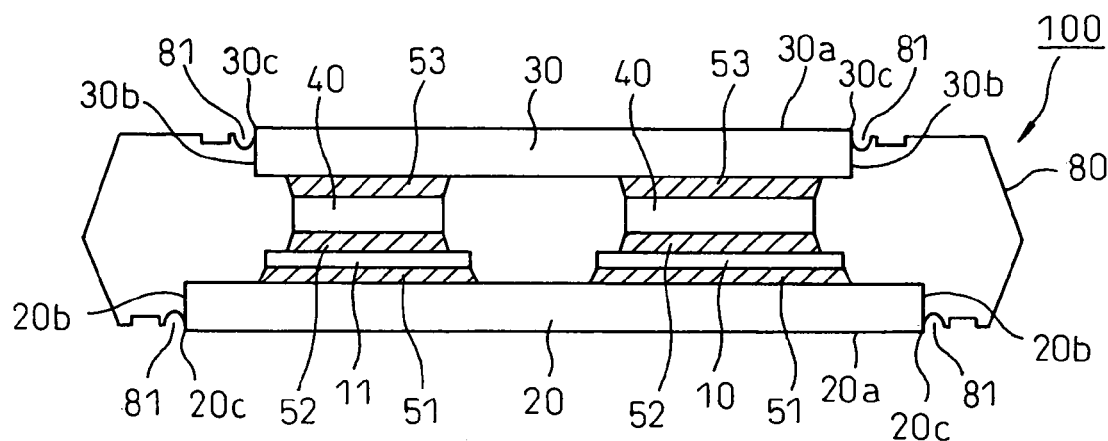
FIG. 2 is a sectional view taken in line II-II in FIG. 1.

FIG. 1 is a plan view schematically showing a semiconductor device 100 according to an embodiment of the invention. FIG. 2 is a diagram schematically showing a sectional structure taken in one-dot chain II-II in FIG. 1, and FIG. 3 a diagram schematically showing a sectional structure taken in one-dot chain III-III in FIG. 1.

In FIG. 1, a molded resin 80 is shown only as an outline thereof, and the planar arrangement of the parts located in the molded resin 80 is shown in a perspective drawing.

Figure 3:
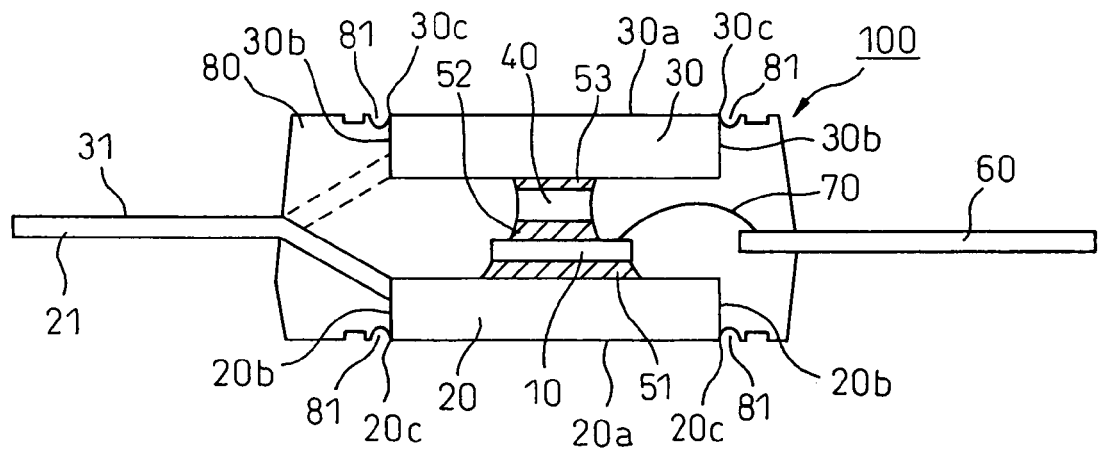
FIG. 3 is a sectional view taken in line III-III in FIG. 1.

As shown in FIGS. 1 to 3, the semiconductor device 100 according to this embodiment includes semiconductor chips 10, 11 constituting semiconductor elements, and a pair of heat sinks 20, 30 formed with a pair of radiator plates arranged on the two surfaces of the semiconductor chips 10, 11 so as to sandwich the semiconductor chips 10, 11, wherein the device 100 is sealed by being covered with the molded resin 80.

The semiconductor device 100 is sealed with the molded resin 80 in such a manner that the outer main surfaces 20a, 30a formed as the radiation surfaces of the pair of the radiator plates 20, 30 are exposed from the molded resin 80.

The heat sink 20 as shown in the lower part of FIGS. 2, 3 is referred to as the lower heat sink 20, and the heat sink 30 shown in the upper part of FIGS. 2, 3 as the upper heat sink 30.

In the semiconductor device 100 shown in FIGS. 1 to 3, the semiconductor chips 10, 11 are sandwiched by a pair of the heat sinks 20, 30 through heat sink blocks 40 of a metal plate and conductive bonding material 51, 52, 53.

Also, according to the present embodiment, the device, as shown in FIGS. 1, 2, includes two semiconductor chips, i.e. a first semiconductor chip 10 and a second semiconductor chip 11, arranged horizontally in parallel to each other. The two semiconductor chips 10, 11 are sandwiched by the pair of the heat sinks 20, 30.

The semiconductor device 100 according to this embodiment may alternatively include a single, three or more semiconductor chips as semiconductor elements sandwiched by a pair of the heat sinks 20, 30.

As shown in FIG. 2, the lower surface of each of the first semiconductor chip 10 and the second semiconductor chip 11 and the upper surface of the lower heat sink 20 are bonded to each other by a first conductive bonding material 51.

Similarly, the upper surface of each of the both semiconductor chips 10, 11 and the lower surface of the heat sink blocks 40 are bonded to each other by a second conductive bonding material 52. Further, the upper surface of each heat sink block 40 and the lower surface of the upper heat sink 30 are bonded to each other by a third conductive bonding material 53.

A solder or a conductive adhesive may be adopted as the first, second and third conductive connecting means 51, 52, 53. A specific example is Sn solder which can be used for the first, second and third conductive connecting means 51, 52, 53 in the semiconductor device 100.

Therefore, the upper surfaces of the first and second semiconductor chips 10, 11 radiate heat through the second conductive connecting means 52, the heat sink blocks 40, the third conductive connecting means 53 and the upper heat sink 30, while the lower surfaces of the first and second semiconductor chips 10, 11 radiate heat from the lower heat sink 20 through the first conductive connecting means 51.

According to this embodiment, the lower heat sink 20 and the upper heat sink 30 are thermally connected with the first and second semiconductor chips 10, 11 i.e. the semiconductor elements, and thus work as the radiator plates for transmitting and radiating heat from the semiconductor chips 10, 11.

In the lower heat sink 20, the lower surface shown in FIGS. 2, 3 is the radiation surface 20a, while in the upper heat sink 30, the upper surface shown in FIGS. 2, 3 is the radiation surface 30a. As shown in FIG. 1, the radiation surfaces 20a, 30a are exposed from the molded resin 80.

The radiation surfaces 20a, 30a of the heat sinks 20, 30 are the largest surfaces of the heat sinks 20, 30 as radiator plates, and represent the outer main surfaces 20a, 30a of a pair of the heat sinks 20, 30, respectively, arranged in opposed relation to each other through the semiconductor chips 10, 11 sandwiched therebetween.

In FIGS. 2, 3, the side surfaces 20b, 30b of the tabular heat sink plates 20, 30 and the boundaries 20c, 30c between the side surfaces 20, 30b and the main surfaces 20a, 30a are shown.

As shown in FIGS. 2, 3, the boundaries 20c, 30c are the edges 20c, 30c, respectively, of the main surfaces 20a, 30a on the one hand and the corners 20c, 30c surrounding the main surfaces 20a, 30a of the heat sinks 20, 30 at the same time.

In this case, the first semiconductor chip 10 and the second semiconductor chip 11, though not specifically limited, can be elements fabricated by the normal semiconductor fabrication technique using the silicon semiconductor substrate.

Specifically, according to this embodiment, the first semiconductor chip 10 used as a semiconductor element can be configured of a power semiconductor element such as IGBT (insulated gate bipolar transistor) or a thyristor.

Also, the second semiconductor chip 11 used as a semiconductor element in this embodiment is formed of, for example, an FWD (a freewheel diode). Specifically, the first and second semiconductor chips 10, 11 may have the shape of a rectangular thin plate.

The obverse surfaces (upper surfaces in FIG. 2) of the first and second semiconductor chips 10, 11 are formed with elements such as transistors, while the reverse surfaces of the first and second semiconductor chips 10, 11 (the lower surfaces in FIG. 2) are not formed with any element.

According to this embodiment, the obverse and reverse surfaces of the first and second semiconductor chips 10, 11 have electrodes not shown. The electrodes, formed of aluminum or the like, have each surface thereof electrically connected with conductive connecting means 51, 52.

As described above, according to this embodiment, the electrodes on the reverse surface of the first and second semiconductor chips 10, 11 are electrically connected to the lower heat sink 20 through the first conductive connecting means 51, while the electrodes on the obverse surfaces of the first and second semiconductor chips 10, 11 are electrically connected to the heat sink block 40 through the second conductive connecting means 52.

Further, the upper heat sink 30 and the heat sink block 40 are electrically connected to each other through the third conductive connecting means 53 on the other surface of each heat sink block 40, which does not face the semiconductor chips 10, 11. Specifically, the electrodes on the obverse surfaces of the first and second semiconductor chips 10, 11 are electrically connected to the upper heat sink 30.

The lower heat sink 20, the upper heat sink 30 and the heat sink blocks 40 are each formed of a metal having a high heat conductivity and a high electrical conductivity such as copper alloy or aluminum alloy. The heat sink blocks 40, on the other hand, may be formed of an ordinary iron alloy.

In this example, the lower heat sink 20 is a substantially rectangular plate as a whole. As shown in FIG. 3, however, a terminal 21 is projected from the side surface 20b of the lower heat sink 20. The terminal 21 is configured as, for example, a lead electrode of the collector electrode which is the main electrode on the main reverse surface of the semiconductor chip 10.

Each heat sink block 40 has a proper size corresponding to each of the semiconductor chips 10, 11. However, the heat sink block 40 may be formed of a rectangular plate slightly smaller than the semiconductor chips 10, 11.

This heat sink block 40 is interposed between the semiconductor chips 10, 11 and the upper heat sink 30, so that the semiconductor chips 10, 11 and the upper heat sink 30 are thermally and electrically connected to each other. At the same time, the heat sink block 40 holds the height between the semiconductor chips 10, 11 and the upper heat sink 30 and hence the height of the bonding wire 70 led out from the first semiconductor chip 10.

Further, as shown in FIG. 3, the terminal 31 is projected from the side surface 30b of the upper heat sink 30 which is a substantially rectangular plate. The terminal 31 is formed as a lead electrode of the emitter electrode, for example, which is the main electrode on the main obverse surface of the semiconductor chip 10.

As described above, the terminal 21 of the lower heat sink 20 and the terminal 31 of the upper heat sink 30 constitute the lead electrodes of the semiconductor chips 10, 11, respectively, and are provided to connect to the external wiring members of the semiconductor device 100. In FIG. 3, the terminal 21 of the lower heat sink 20 and the terminal 31 of the upper heat sink 30 are shown by superposing one on the other.

The lower heat sink 20 and the upper heat sink 30, each constructed as a metal plate functioning as an electrode and a radiator plate at the same time, can radiate heat from the semiconductor chips 10, 11 and connect electrodes of the semiconductor chips 10, 11, on the other hand, of the semiconductor device 100.

As shown in FIGS. 1, 3, signal terminals 60 are arranged around the first semiconductor chip 10 in the molded resin 80. The signal terminals 60 are formed of a conductive material such as copper 42 or alloy, and as a lead frame, for example, as in this case.

According to this embodiment, the signal terminals 60 are plural in number, as shown in FIG. 1, and terminals electrically connected to the signal electrode (such as the gate electrode) and reference terminals, arranged on the main surface of the first semiconductor chip 1.

As shown in FIG. 1, each signal terminal 60 is physically and electrically connected to a wire 70 and a pad (not shown) on the outer periphery of the first semiconductor chip 10 in the molded resin 80. Each wire 70, which is formed of gold or aluminum, can be formed by wire bonding.

Thus, each signal terminal 60 can be electrically connected with the semiconductor chip 10 by an inner lead located in the molded resin 80 on the one hand and be electrically connected with an external circuit through an outer lead projected from the molded resin 80 on the other hand.

The semiconductor device 100 is formed as a flat parallelepiped and has the two flat main surfaces to which the radiation surfaces 20a, 30a of the radiator plates 20, 30 are exposed. Further, from the narrow side surfaces of the semiconductor device 100, a plurality of power outer leads and a plurality of control outer leads are extended. In the semiconductor device 100 according to this embodiment, a plurality of power outer leads are extended from one of the two opposed narrow side surfaces, and a plurality of control outer leads from the other side surface.

Further, with the semiconductor device 100 according to this embodiment, substantially the whole structure 100 thereof is sealed with the molded resin 80. Except for the radiation surfaces 20a, 30a, the device 100 is covered and sealed by the molded resin so that the outer main surfaces 20a, 30a, which are the radiation surfaces of a pair of the heat sinks 20, 30 are exposed from the molded resin 80.

Specifically, as shown in FIGS. 1 to 3, the molded resin 80 is filled hermetically in the gaps between the heat sink pair 20, 30 and around the semiconductor chips 10, 11 and the heat sink blocks 40.

As described above, the outer main surfaces of the heat sink pair 20, 30, i.e. the radiation surface 20a of the lower heat sink 20 and the radiation surface 30a of the upper heat sink 30 are exposed from the molded resin 80.

This molded resin 80 can be formed of a normal mold material such as epoxy resin. Also, the heat sinks 20, 30, etc. can be easily sealed with the molded resin 80 using a die (FIG. 4) having upper and lower dies according to the transfer mold process.

The semiconductor device 100 according to this embodiment configured as described above further has a unique configuration described below.

As described above, the semiconductor device 100 according to this embodiment is so configured that the radiation surfaces 20a, 30a, which are the outer main surfaces of the heat sink pair 20, 30 are exposed from the molded resin 80. Further, the neighborhood of the boundaries between the main surfaces and the side surfaces are exposed. According to this embodiment, as shown in FIGS. 2, 3, a part of the side surfaces 20b, 30b of each heat sink 20, 30 and the boundaries between a part of the side surfaces 20b, 30b and the main surfaces 20a, 30a, i.e. the edges 20c, 30c, which are corners surrounding the main surfaces 20a, 30a are also exposed from the molded resin 80.

Specifically, as shown in FIGS. 2, 3, a groove 81 is formed in the molded resin 80 around each of the radiation surfaces 20a, 30a of a pair of the heat sinks 20, 30. In this case, each groove 81 is annular in shape.

The side surfaces 20b, 30b of the heat sinks 20, 30 and the edges 20c, 30c of the main surfaces 20a, 30a, which are the boundaries described above, are exposed through the grooves 81.

As described above, the semiconductor device 100 according to this embodiment are sealed and covered with the molded resin 80 in such a manner as to expose the radiation surfaces 20a, 30a of the radiator plates 20, 30.

Further, the corners 20c, 30c surrounding the radiation surfaces 20a, 30a of the radiator plates 20, 30 and the narrow area in the neighborhood of the corners 20c, 30c of the side surfaces 20b, 30b are exposed as well as the radiation surfaces 20a, 30a. In other words, the parts other than the exposed portions including the radiation surfaces 20a, 30a, the corners 20c, 30c, the narrow area of the side surfaces 20b, 30b and the lead frames 60 are covered and sealed by the molded resin 80.

Next, a method of fabricating the semiconductor device 100 having the aforementioned configuration will be explained. First, the semiconductor chips 10, 11 and the heat sink blocks 40 are soldered on the upper surface of the lower heat sink 20.

Specifically, the first and second semiconductor chips 10, 11 are stacked through solder foils of Sn, for example, on the upper surface of the lower heat sink 20, while the heat sink blocks 40 are stacked on the semiconductor chips 10, 11, respectively, through similar solder foils.

After that, the solder is heated to a temperature higher than the melting point by a heater (reflow device) so that the solder foils are melted and then hardened.

Then, the first semiconductor chip 10 and the signal terminals 60 are connected to each other by wire bonding. As a result, the first semiconductor chip 10 and the signal terminals 60 are physically and electrically connected to each other by the wires 70.

As the next step, the upper heat sink 30 is soldered on the heat sink blocks 40. Specifically, the upper heat sink 30 is placed through a solder foil on the heat sink blocks 40. The solder foil, after being melted by the heater, is hardened.

Once the melted solder foil is hardened, the hardened solder foils form first conductive connecting means 51, second conductive connecting means 52 and third conductive connecting means 53.

Through the conductive connecting means 51 to 53, the physical, electrical and thermal connection are established between the lower heat sink 20, the semiconductor chips 10, 11, the heat sink blocks 40 and the upper heat sink 30.

Conductive adhesives can be used as the first, second and third conductive connecting means 51, 52, 53, if the solder is replaced by the conductive adhesive, and the conductive adhesive is coated and hardened. In this way, the lower heat sink 20, the semiconductor chips 10, 11, the heat sink blocks 40 and the upper heat sink 30 are physically, electrically and thermally connected to each other by the conductive adhesives.

After that, the molding resin 80 is filled in the gap and on the outer periphery of the heat sinks 20, 30 by using a molding die according to the transfer molding process. As a result, as shown in FIGS. 1 to 3, the gap and the outer periphery of the heat sinks 20, 30 are filled and sealed with the molding resin 80.

After hardening the molding resin 80 filled in this way, the die (molding die) is released, and the semiconductor device 100 is taken from the die. Thus, the semiconductor 100 is completed.

According to this embodiment, the sealing process using the molding resin 80 employs a special method as described below. This method of forming the mold resin 80 will be explained with reference to FIG. 4.

Figure 4A:
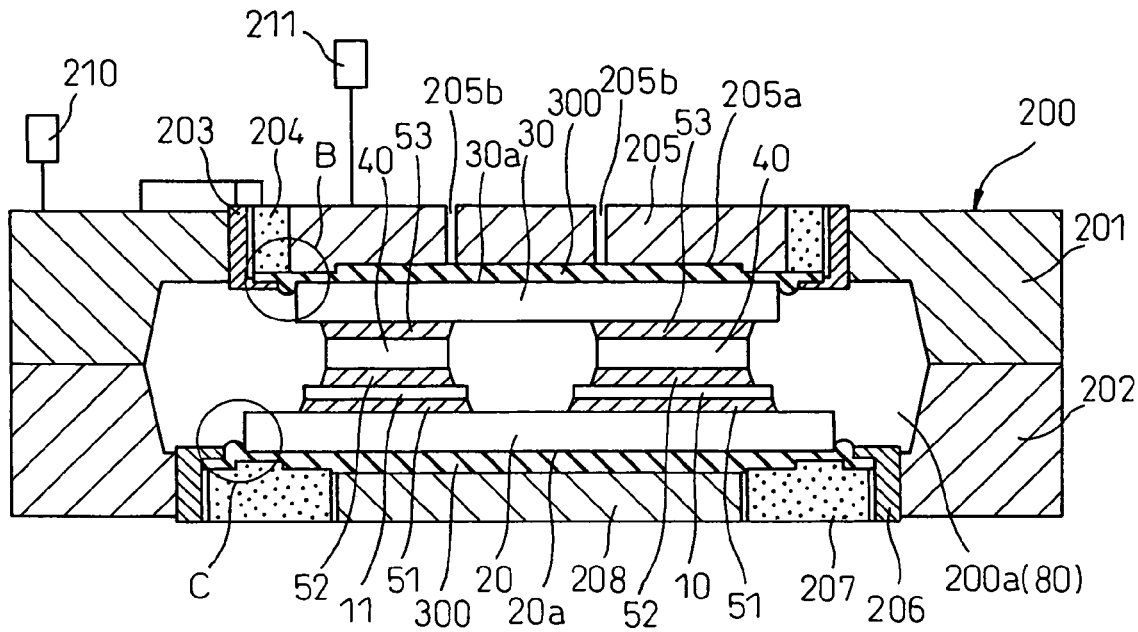
FIG. 4a is a sectional view schematically showing a method of forming the mold resin using a die for sealing the resin as an apparatus to fabricate the semiconductor device according to the same embodiment.
Figure 4B:
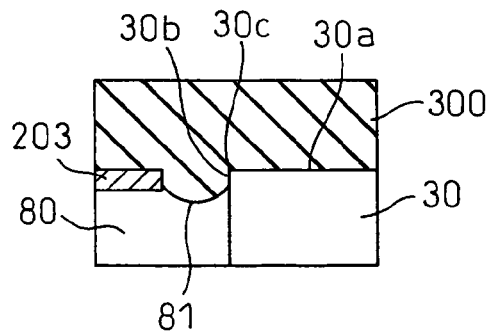

FIG. 4a is a sectional view schematically showing the method of forming the molding resin using a resin-sealing die 200 for fabricating the semiconductor device 100 according to this embodiment. FIG. 4b is an enlarged view of the portion B in FIG. 4a, FIG. 4c an enlarged view of the portion C in FIG. 4a, and FIGS. 4d, 4e are enlarged views of the neighborhood of a depression 205a to prevent an excessive pressure on each sheet 300 of the die 200. FIG. 4 shows the state in which the molding resin 80 is filled in the cavity 200a of the die 200.

The apparatus for fabricating the semiconductor device 100 according to this embodiment, except for the die 200, can be configured similarly to an ordinary semiconductor device fabrication apparatus for fabricating by molding resin.

The die 200 is made of carbon steel or a like iron metal and includes an upper die 201, a lower die 202 and a plurality of nested dies 203, 204, 205, 206, 207, 208. The upper and lower dies and the nested dies 201 to 208 are combined with each other to form the internal cavity 200a.

A work is prepared in which the semiconductor chips 10, 11 are sandwiched between the heat sinks 20, 30 and connected with the signal terminals 60 by the wires 70. This work is arranged in the cavity 200a of the die 200, into which the resin is injected and filled. By doing so, the assembly is sealed by the molded resin 80.

In the die 200 shown in FIG. 4a, the lower portions 202, 206, 207, 208 of the die 200 are fixed, while the upper portions 201, 203, 204, 205 of the die 200 are movable.

Specifically, the upper die 201 and the nested dies 203, 204 of the upper portions can apply a desired load to the work by a first drive unit 210, while the nested die 205 can apply the desired load to the work by a second drive unit 211 independently of the three dies including the upper die 201 and the nested dies 203, 204.

The first drive unit 210 and the second drive unit 211 may be an air cylinder, a hydraulic cylinder or a servo motor which can control the applied load.

Further, in the die 200 according to this embodiment, a pair of heat-resistant, flexible sheets 300 slightly larger than the radiation surfaces 20a, 30a are arranged in opposite to the radiation surfaces 20a, 30a, i.e. the outer main surfaces of the heat sinks 20, 30, respectively.

The sheets 300 are formed of a material containing fluororesin or silicone resin. Specifically, the sheets 300 can be a fluororesin rubber sheet or a silicon rubber sheet.

The upper sheet 300 held by the combined nested dies 203, 204, 205 is mounted on the upper die 201, while the lower sheet 300 held by the nested dies 206, 207, 208 is mounted on the lower die 202.

As shown in FIG. 4a, the outer peripheral edge of the upper sheet 300 is sandwiched between the nested die 203 and the nested die 204, and as shown in FIG. 4b, the forward end of the nested die 203 provides a limiter for restricting the radially outward extension of the upper sheet 300.

Figure 4C:
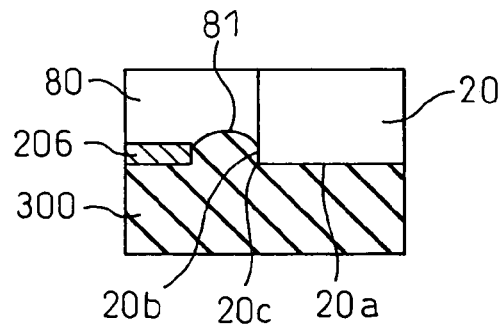
Figure 4D:
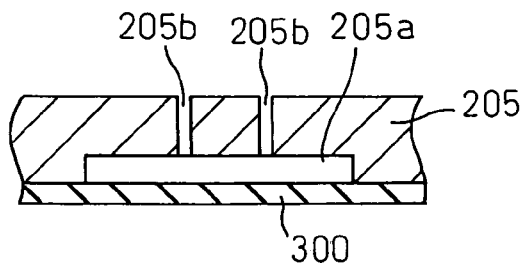
FIGS. 4d and 4e enlarged views of the neighborhood of the not to excessively press the sheet of the die.
Figure 4E:
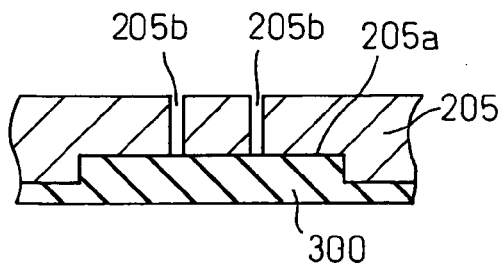
Figure 8A:
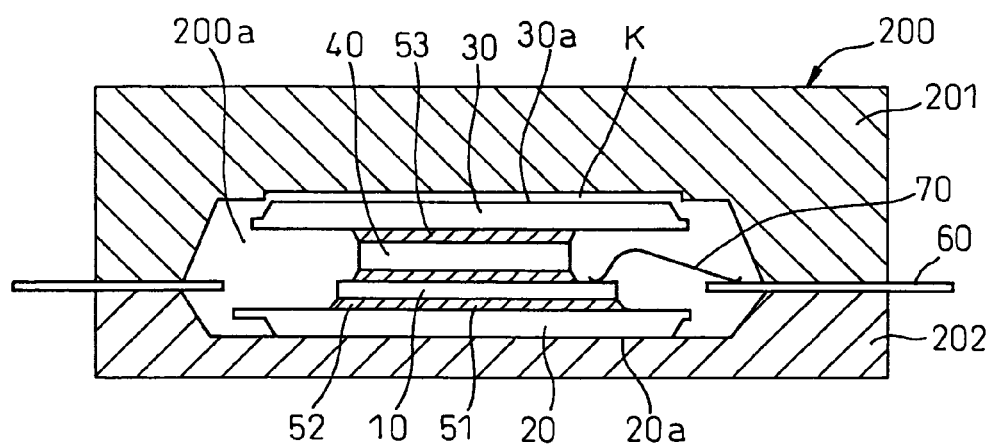
FIGS. 8a and 8b are sectional views schematically showing a method of forming the mold resin using a die for the conventional ordinary semiconductor device.
Figure 8B:
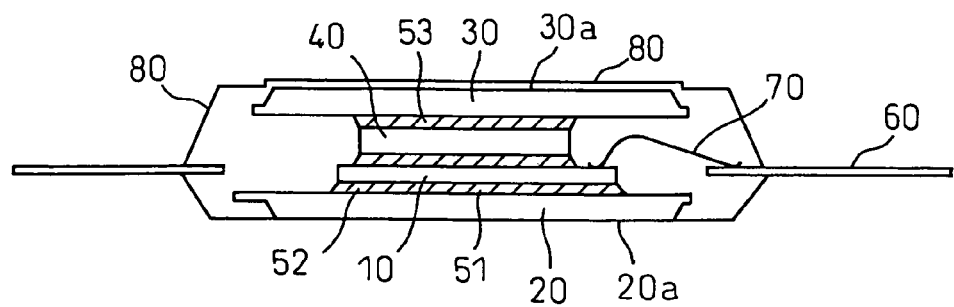

As shown in FIG. 4a, the outer peripheral edge of the lower sheet 300 is similarly sandwiched between the nested dies 206 and 207, and as shown in FIG. 4c, the forward end of the nested die 206 provides a limiter to restrict the radially outward extension of the lower sheet 300.

The work is arranged on the lower die 202 with the lower sheet 300 mounted thereon, and the upper die 201 with the upper sheet 300 mounted thereon is set on the lower die 202. Then, the upper and lower dies 201, 202 are clamped by the first drive unit 210.

In the process, a load applied on the upper nested die 205 by the second drive unit 211 presses the upper and lower sheets 300 closely against the radiation surfaces 20a, 30a, respectively, of the heat sinks 20, 30. Under this condition, the peripheral portions of the sheets 300, which are somewhat larger than the radiation surfaces 20a, 30a, are extended over the ends of the radiation surfaces 20a, 30a.

Each sheet 300 is a flexible sheet having a sufficient plasticity and volume capable of forming a bulge by slightly extension under an external pressure.

The die 200 defines a chamber between the radiation surfaces 20a, 30a. The sheets 300 are held in the chamber. The chamber has sufficient volume to be filled up with the sheets 300 when the die 200 is closed. The die 200 defines a thin slit opening along the whole periphery of each of the radiation surfaces 20a, 30a.

Each sheet 300 in the chamber is exposed inward the cavity of the die 200 by way of the corresponding slit opening. The sheets 300 have a flexibility sufficient to be expanded and projected into the cavity by way of the slit openings.

As long the die 200 is closed, the sheets 300 are kept in close contact with the radiation surfaces 20a, 30a, and the radially outward flow of the sheets 300 is restricted by the limiter. As a result, the sheets 300 are expanded and projected by way of the slit openings and cover the area extending from the radiation surfaces 20a, 30a to the side surfaces 20b, 30b. The resultant bulges are formed so as to surround the whole periphery of the radiation surfaces 20a, 30a.

These bulges each form a groove 81 in the molded resin 80 injected into the cavity 200a. Therefore, after the bulges are formed, the molding resin can be injected.

Alternatively, the bulges may be formed after the molding resin is injected and before it is hardened. The sheets 300 are flexible and heat resistant to such a degree as to maintain the expanded form of the bulge against the injection pressure of the molding resin 80.

As shown in FIGS. 4a, 4d, 4e, the portion of the die 200 facing the main surface 30a of the upper heat sink 30, which is contacted by the sheet 300, i.e. the inner surface of the nested die 205 is formed with a depression 205a to prevent from excessively press the sheet 300.

Before a load is applied on the nested die 205, as shown in FIG. 4d, the sheet 300 is not deformed, and the portion of the upper sheet 300 corresponding to the depression 205a is spaced from the nested die 205.

After the dies are clamped and a load is applied on the nested die 205 by the second drive unit 211, the portion of the upper sheet 300 located above the main surface 30a of the upper heat sink 30 tends to be deformed.

The depression 205a in the nested die 205, however, saves the crush of the upper sheet 300 as shown in FIG. 4e, so that the sheet 300 is deformed, but this deformed portion intrudes into the depression 205a.

Therefore, the excessive stress which would otherwise be applied on the upper heat sink 30 by the crush of the upper sheet 300 can be absorbed by the depression 205a on the opposite side from the upper heat sink 30.

Also, the nested die 205 is formed with an air venting hole 205b communicating with the atmosphere from the depression 205a. Even in the case where the sheet 300 is in close contact with the nested die 205, therefore, the interior of the depression 205a forms no hermetic ally-closed space and the deformation of the sheet 300 toward the depression 205a is desirably assisted.

In this way, the radiation surfaces 20a, 30a are pressed against the sheets 300, and therefore, as shown in FIG. 4, the sheets 300 cover the radiation surfaces 20a, 30a and part of the side surfaces 20b, 30b of the heat sinks 20, 30. Under this condition, the resin is injected and filled to seal the assembly with the molded resin 80.

During the process of injecting and filling the resin, the upper nested die 205 is immovably locked and fixed by the second drive unit 211.

In the process, the radiation surfaces 20a, 30a of the heat sinks 20, 30 are pressed against the heat-resistant, flexible sheets 300 slightly larger than the radiation surfaces 20a, 30a, and therefore the sheets 300 are deformed so that the radiation surfaces 20a, 30a sink into the sheets 300. Thus, the radiation surfaces 20a, 30a of the heat sinks 20, 30 are covered closely with the sheets 300.

At the same time, each portion of the sheets 300 extended from the radiation surfaces 20a, 30a of the heat sinks 20, 30 is deformed into a bulge, as shown in FIG. 4. The bulge comes into close contact with and covers part of the side surfaces 20b, 30b and the edges 20,c 30c forming the boundaries between the main surface 20a, 30a and the side surface 20b, 30b.

In other words, the portion of each heat sink 20, 30 extending from the edges 20c, 30c of the main surfaces 20a, 30a to the side surfaces 20b, 30b, in addition to the radiation surfaces 20a, 30a, which is the outer main surfaces of the heat sinks 20, 30, is covered with the deformed sheets 300.

The work with a part of the heat sinks 20, 30 covered by the sheets 300 is sealed with the molded resin 80. Then, no resin intrudes into the portion of the heat sinks 20, 30 which is covered by the sheets 300, and such a portion is kept free of the molded resin 80.

After filling and hardening the resin in the cavity 200a of the die 200, the die 200 is released. Then, the work sealed with the molded resin 80 is removed from the die 200, thereby completing the semiconductor device 100.

As described above, in the semiconductor device 100 thus completed, the radiation surfaces 20a, 30a of the heat sinks 20, 30 are exposed and a groove 81 is formed at the portion of the molded resin 80 around each of the radiation surfaces 20a, 30a. A part of the side surfaces 20b, 30b and the edges 20c, 30c of the heat sinks 20, 30 are exposed by the groove 81.

Specifically, the semiconductor device 100 is so configured that in addition to the radiation surfaces 20a, 30a of the heat sinks 20, 30 served as the radiator plates, the corners 20c, 30c surrounding the radiation surfaces 20a, 30a and the small area in the neighborhood of the corners 20c, 30c of the side surfaces 20b, 30b are exposed. Thus, the heat sinks 20, 30, the semiconductor elements 10, 11 and the lead frames 60 other than the exposed portions of the radiation surfaces 20a, 30a, the corners 20c, 30c, the narrow area of the side surfaces 20b, 30b and the lead frames 60 are covered with the molded resin 80, and at least the semiconductor elements 10, 11 are sealed.

As a result, in the semiconductor device 100, the parts other than at least the radiation surfaces 20a, 30a are covered and sealed by the molded resin 80, while at least the radiation surfaces 20a, 30a of the heat sinks 20, 30 are appropriately exposed.

According to this embodiment, there is provided a semiconductor device comprising semiconductor chips 10, 11 as semiconductor elements, and heat sinks 20, 30 as radiator plates thermally connected with the semiconductor chips 10, 11, the device being covered and sealed with the molded resin 80 so as to expose the outer main surfaces 20a, 30a of the heat sinks 20, 30 from the molded resin 80, wherein a part of the side surfaces 20b, 30b and the boundaries 20c, 30c with the main surfaces 20a, 30a connected to a part of the side surfaces 20b, 30b of the heat sinks 20, 30, in addition to the outer main surfaces 20a, 30a of the heat sinks 20, 30, are exposed from the molded resin 80.

Especially, in the semiconductor device 100 according to this embodiment, a part of the side surfaces 20b, 30b of the heat sink pair 20, 30 and the boundaries 20c, 30c with the main surfaces 20a, 30a connected to a part of the side surfaces 20b, 30b, in addition to the outer main surfaces 20a, 30a of the heat sink pair 20, 30, are exposed from the molded resin 80.

Specifically, the semiconductor device according to this embodiment has a two-side radiation structure in which the semiconductor elements are connected thermally with the radiator plates and the assembly is sealed with the molded resin so as to expose the outer main surfaces, which are the radiation surfaces, of the radiator plates from the molded resin, wherein the semiconductor elements are sandwiched on both sides thereof by a pair of the radiator plates, and the heat radiation surfaces of the radiator plates are exposed from the molded resin.

According to the semiconductor device 100 of this embodiment, when the radiation surfaces of a pair of heat sinks 20, 30, i.e. the outer main surfaces 20a, 30a are machined for the purpose of securing the parallelism between the main surfaces 20a, 30a, for example, the machining tool such as a cutting tool or a grinding stone can be in contact with only the heat sinks 20, 30 but not the molded resin 80, because the boundaries 20c, 30c between the side surfaces 20b, 30b and the main surfaces 20a, 30a and parts of the side surfaces 20b, 30b connected to the boundaries 20c, 30c are also exposed from the molded resin 80.

The portions of the heat sinks 20, 30 which are exposed from the molded resin 80 include, in addition to the outer main surfaces 20a, 30a, which are the radiation surfaces, the area extending from the edges 20c, 30c to the side surfaces 20b, 30b.

In machining the main surfaces 20a, 30a served as the radiation surfaces, therefore, the machining tool such as the cutting tool or the grinding stone, even if the machining member intrudes by way of the edges 20c, 30c of the main surfaces 20a, 30a, can cut only the heat sinks 20, 30 but not the molded resin 80.

According to this embodiment, therefore, there is provided a semiconductor device 100 comprising the semiconductor chips 10, 11 sandwiched between the heat sink pair 20, 30 and sealed with molded resin 80, wherein the radiation surfaces of the heat sinks 20, 30 are appropriately exposed so that the outer main surfaces 20a, 30a, which are the radiation surfaces of the heat sinks 20, 30 can be machined while at the same time suppressing the consumption of the machining tool, resulting in a remarkable improvement of the machining member life.

In the semiconductor device 100 according to this embodiment, as shown in FIGS. 2, 3, a groove 81 is formed on the portion of the molded resin 80 around the outer main surfaces 20a, 30a of each of the pair of the heat sinks 20, 30. By the groove 81, the side surfaces 20b, 30b and the boundaries 20c, 30c of the heat sinks 20, 30 are exposed.

According to this embodiment, the semiconductor device 100 shown in FIGS. 1, 2 includes a plurality of the semiconductor chips 10, 11 sandwiched between the heat sink pair 20, 30.

As described above, in the case where the semiconductor chips 10, 11 are plural in number, the parallelism between the opposed radiation surfaces 20a, 30a may be difficult to achieve due to the often different thickness between the semiconductor chips 10, 11.

Thus, a special machining process on the main surfaces 20a, 30a is required to secure the parallelism between the main surfaces 20a, 30a served as the radiation surfaces of the heat sinks 20, 30. In other words, the advantages of the semiconductor device 100 according to this embodiment described above are exhibited especially effectively in the case where a plurality of the semiconductor chips 10, 11 are sandwiched between the heat sink pair 20, 30.

Further, according to this embodiment, there is provided a method of fabricating a semiconductor device, wherein a pair of the heat sinks 20, 30 are arranged on the two surfaces of the semiconductor chips 10, 11 so as to sandwich the semiconductor chips 10, 11, and the resulting assembly is arranged in the die 200 and sealed by the molding resin. This fabrication method is described below.

Specifically, according to this fabrication method, the portion of the die 200 facing each of the outer main surfaces 20a, 30a of the heat sink pair 20, 30 has a heat-resistant, flexible sheet 300 slightly larger than the main surfaces 20a, 30a, and the main surfaces 20a, 30a are pressed against the sheet 300. Then, the device is sealed with the molding resin while the main surfaces 20a, 30a and a part of the side surfaces 20b, 30b of the heat sinks 20, 30 are covered with the sheets 300.

According to this method, as described above, the main surfaces 20a, 30a of the heat sinks 20, 30, when pressed against the sheets 300, sink into the sheets 300, so that the main surfaces 20a, 30a, a part of the side surfaces 20b, 30b and the boundaries 20c, 30c of the heat sinks 20, 30 are covered with the deformed sheets 300.

Under this condition, the assembly is sealed with the molding resin. Thus, the semiconductor device 100 according to the embodiment described above is fabricated suitably.

According to this embodiment, the radiation surfaces of the heat sinks 20, 30 are appropriately exposed. Therefore, the outer main surfaces 20a, 30a i.e. the radiation surfaces of the heat sinks 20, 30 can be machined by the machining tool, while the molded resin cannot be touched by the machining tool. As a result, consumption of the machining tool can be reduced and the machining tool life is lengthened.

In the fabrication method according to this embodiment, the sheets 30 may be formed of a material containing fluorine or silicon resin.

Further, according to this embodiment, there is provided a fabricating apparatus for fabricating a semiconductor device, comprising a die 200 in which a work with a pair of heat sinks 20, 30 arranged on the two surfaces of the semiconductor chips 10, 11 so as to sandwich the semiconductor chips 10, 11 is covered and sealed by the molding resin, as described below.

Specifically, the die 200 is so configured that the portion thereof facing each of outer main surfaces 20a, 30a of a pair of the heat sinks 20, 30 has a heat-resistant, flexible sheet 300 slightly larger than the main surfaces 20a, 30a, which sheets 300 cover the main surfaces 20a, 30a and a part of the side surfaces 20b, 30b of the heat sinks 20, 30.

With this configuration, a fabricating apparatus is provided by which the method of fabricating the semiconductor device 100 according to this embodiment can be appropriately implemented.

Also, with this fabricating apparatus, the semiconductor device 100 with the semiconductor chips 10, 11 sandwiched by the heat sink pair 20, 30 and sealed with the mold resin 80 can be fabricated in such a manner that the radiation surfaces of the heat sinks 20, 30 can be appropriately exposed and, also, the main surfaces 20a, 30a served as the radiation surfaces of the heat sinks 20, 30 can be machined while suppressing the consumption of the machining tool, thereby improving the machining tool life remarkably.

The sheets 300 on the die according to this embodiment are made of a material containing a fluorine or a silicone resin.

As described above, according to this embodiment, there is provided a method of fabricating a semiconductor device having a two-side radiation structure and a die used for the fabrication method, wherein the semiconductor elements are thermally connected with the radiator plates and the resulting assembly is sealed with the molded resin so as to expose the outer main surfaces of the radiator plates from the mold resin, and wherein the two surfaces of the semiconductor elements are sandwiched by a pair of the radiator plates are exposed from the molded resin.

In the fabrication method and the fabrication apparatus described above in this embodiment, the portion of the die 200 facing the outer main surfaces 20a, 30a of the heat sink pair 20, 30 has the sheet 300, against which the main surface 20a, 30a are pressed. In this way, the semiconductor device is sealed with the molded resin 80 while covering the sheets 300 on the main surface 20a, 30a and a part of the side surfaces 20b, 30b of the heat sinks 20, 30.

In the fabrication method and the fabrication apparatus according to this embodiment, the main surfaces 20a, 30a are pressed against the sheet 300 to such a degree that at least the outer periphery of the main surfaces 20a, 30a and a part of the side surfaces 20b, 30b of the heat sinks 20, 30 may be covered by the sheets 300.

Specifically, sheets 300 made of any kind of a heat-resistant, flexible material slightly larger than the main surfaces 20a, 30a of the heat sinks 20, 30 can be used, and the portion of each sheet 300 pressed against the heat sinks 20, 30 by the die 200 is not necessarily the whole but only the outer peripheral edge of the main surfaces 20a, 30a.

The shape of the die can be appropriately changed, for example, in such a manner that each sheet 300 is in contact with and pressed against only the outer peripheral edge but not the central portion of the main surfaces 20a, 30a of the heat sinks 20, 30.

Further, the sheets 300 have an opening at the central part thereof corresponding to the central part of the main surfaces 20a, 30a may be used.

FIG. 5 is a sectional view schematically showing a method of forming the molded resin 80 using a die 200 and the sheet 300 having the opening according to a modification of this embodiment. In FIG. 5, assume that the lower sheet 300 has an opening at the central part thereof.

In the case shown in FIG. 5, the fixed nested die 208 of the die 200 is kept in direct contact with the main surface 20a of the lower heat sink 20 through the opening of the lower sheet 300.

At the time of sealing the molding resin, therefore, the work is supported by the die 200 not using the flexible sheet 300 as shown in FIG. 4, but with the nested die 208 higher in rigidity. As a result, the die 200 can be clamped more sufficiently.

Also in the case shown in FIG. 5, the outer peripheral edge of the main surface 20a and the side surface 20b of the lower heat sink 20 are in close contact with the sheet 300. Therefore, the intrusion of resin onto the main surface 20a of the lower heat sink 20 is prevented, and a resin burr is hardly formed.

FIG. 6 is a sectional view schematically showing another modification of this embodiment. As shown in FIG. 6, the edges 20c, 30c of the main surfaces 20a, 30a of the heat sinks 20, 30 may have a step.

According to this modification, the work in the die 200 is molded by resin, as shown in FIG. 6. As the stepped edges 20c, 30c and the sheet 300 can be kept in closer contact with each other, the resin burr is not formed.

OTHER EMBODIMENTS

The heat sinks 20, 30 i.e. radiator plates are not necessarily substantially rectangular plates described above, but triangular, round or otherwise appropriately designed forms can be used.

The semiconductor elements are not limited to IGBI (insulated gate bipolar transistor), the thyristor or the like power semiconductor element or FWD (freewheel diode) described above.

Although the side surfaces 20b, 30b of the heat sinks 20, 30 of the semiconductor device 100 according to the embodiments described above are exposed from the mold resin 80 partially in a predetermined range from the edges 20c, 30c of the main surfaces 20a, 30a, the entire area of the side surfaces 20b, 30b may alternatively be exposed.

In spite of the aforementioned configuration in which the heat sink blocks 40 are interposed between the semiconductor chips 10, 11 and the upper heat sink 30 to secure the height between the first semiconductor chip 10 and the upper heat sink 30, the heat sink blocks 40 may be removed, if possible, in the embodiments described above.

In place of the heat sink blocks 40, for example, protrusions may be formed from the upper heat sink 20 toward the semiconductor chips 10, 11 to function as the heat sink blocks 40. Also, in the case where the height is not required to be secured between the semiconductor chips and the upper heat sink, on the other hand, the heat sink blocks 40 may be done without.

The radiator plates are not limited to the heat sinks described above but may be lead frame islands or the like.

Also, according to the embodiments described above, the two-side radiator plate is used to sandwich the semiconductor elements 10, 11 and the radiation surfaces 20a, 30a of the radiator plates 20, 30 are exposed from the molded resin 80.

This invention, however, is not limited to the two-side radiator plate, and a radiator plate may be thermally connected to only one of the surfaces of a semiconductor element, and the outer main surface, i.e. the radiation surface of the single radiator plate may be exposed from the molded resin.

In the configuration in which the two surfaces of a semiconductor element are sandwiched by a pair of radiator plates, the radiation surface of one instead of the two radiator plates may be exposed from the molded resin.

Specifically, the semiconductor device may have at least one radiation surface. The parts other than the radiation surface may be covered and sealed with the molded resin so as to expose at least the radiation surface of the radiator plates.

In short, the present invention is not only applied to a semiconductor device in which the two surfaces of at least a semiconductor element are sandwiched by a pair of radiator plates and sealed with the molded resin so as to expose the radiation surfaces of the radiator plates, but also includes a semiconductor device comprising at least a semiconductor element and a radiator plate thermally connected to the semiconductor element and sealed with the molded resin so as to expose the outer main surfaces of the radiator plate from the molded resin. The present invention is characterized by the portion of the radiator plates including the radiation surfaces and the area extending from the edges to the side surfaces are exposed from the molded resin, or a die having the sheets described above used to realize the exposure structure. Other parts can be appropriately redesigned.

What is claimed is:

1. A method of fabricating a semiconductor device, wherein a work including at least one semiconductor element and at least one radiator plate which is thermally connected to the semiconductor element is arranged in a die so as to be covered and sealed with a molded resin, comprising the steps of:

arranging a heat-resistant and flexible sheet larger than an outer main surface of the radiator plate on a part of the die facing the main surface;

forming a bulge in the sheet by pressing the sheet against the main surface, the bulge covering at least a part of a side surface of the radiator plate adjoining the main surface of the radiator plate; and injecting the resin into the die.

2. A method of fabricating a semiconductor device according to claim 1, wherein the at least one radiator plate includes a pair of radiator plates, each of which respectively arranged on both surfaces of said semiconductor element so as to sandwich said semiconductor element.

3. A method of fabricating a semiconductor device according to claim 1, wherein the sheet is formed of a material containing selected one of fluorine resin and silicon resin.

4. A method of fabricating a semiconductor device according to claim 1, wherein pressing the main surface against the sheet includes pressing the whole main surface against the sheet.

5. A method of fabricating a semiconductor device according to claim 1, wherein pressing the main surface against the sheet includes pressing only the outer peripheral part of the main surface against the sheet.

6. A method of fabricating a semiconductor device according to claim 1, the die comprises an upper die and a lower die and the method comprises:

activating a first drive unit to move one of the upper and lower dies with respect to the other of the upper and lower dies in a first direction; and activating a second drive unit different from the first drive unit to move a portion of the one die in the first direction.

* * * * *